(12) United States Patent
Procopio et al.

(10) Patent No.: US 10,031,155 B2
(45) Date of Patent: Jul. 24, 2018

(54) INTEGRATED PIEZOELECTRIC SENSOR FOR DETECTING IN-PLANE FORCES, SUCH AS SHOCKS, ACCELERATIONS, ROTATIONAL FORCES

(71) Applicant: STMicroelectronics S.r.l., Agrate Brianza (IT)

(72) Inventors: Francesco Procopio, Sedriano (IT); Carlo Valzasina, Gessate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 169 days.

(21) Appl. No.: 14/971,155

(22) Filed: Dec. 16, 2015

(65) Prior Publication Data

US 2016/0320425 A1 Nov. 3, 2016

(30) Foreign Application Priority Data

Apr. 30, 2015 (IT) ................ TO2015A0237

(51) Int. Cl.
*G01P 15/09* (2006.01)
*G01L 1/16* (2006.01)
*H01L 41/113* (2006.01)
*H01L 41/25* (2013.01)
*H01L 41/27* (2013.01)
*G01P 15/08* (2006.01)

(52) U.S. Cl.
CPC ............... *G01P 15/09* (2013.01); *G01L 1/16* (2013.01); *G01P 15/0922* (2013.01); *H01L 41/1132* (2013.01); *H01L 41/25* (2013.01); *H01L 41/27* (2013.01); *G01P 2015/0817* (2013.01)

(58) Field of Classification Search
USPC .......................... 73/514.34, 514.16
See application file for complete search history.

(56) References Cited

U.S. PATENT DOCUMENTS

| | | | | |
|---|---|---|---|---|
| 4,255,965 A | * | 3/1981 | Schulz | G01H 1/00 310/327 |
| 4,373,396 A | * | 2/1983 | Johnson | G01L 9/0022 73/35.11 |
| 4,431,935 A | * | 2/1984 | Rider | G01C 19/5642 310/329 |
| 5,233,256 A | * | 8/1993 | Hayashi | H01L 41/0926 310/317 |
| 5,239,870 A | * | 8/1993 | Kaneko | G01P 15/123 338/46 |

(Continued)

FOREIGN PATENT DOCUMENTS

| | | |
|---|---|---|
| CN | 102967730 A | 3/2013 |
| CN | 103674351 A | 3/2014 |
| EP | 0 938 143 A1 | 8/1999 |

*Primary Examiner* — Clayton E Laballe
*Assistant Examiner* — Warren K Fenwick
(74) *Attorney, Agent, or Firm* — Seed Intellectual Property Law Group LLP

(57) ABSTRACT

The piezoelectric sensor is formed in a semiconductor material chip having a surface defining a plane and integrating a structure for sensing forces acting in the plane. The chip is formed by a substrate defining a cantilever having a first end, constrained to an anchorage portion of the substrate, and a second end, which is free to bend under the action of external forces. The cantilever has first and second longitudinal halves, each carrying a respective strip element of piezoelectric material, which extends parallel to the chip plane.

20 Claims, 4 Drawing Sheets

(56) References Cited

U.S. PATENT DOCUMENTS

| | | | | |
|---|---|---|---|---|
| 5,276,672 A * | 1/1994 | Miyazaki | B82Y 35/00 | 310/331 |
| 5,629,483 A * | 5/1997 | Nakamura | G01P 15/09 | 310/321 |
| 5,889,208 A * | 3/1999 | Nose | G01C 19/5656 | 73/504.12 |
| 6,130,464 A * | 10/2000 | Carr | G01P 15/036 | 257/417 |
| 6,629,462 B2 * | 10/2003 | Otsuchi | G01P 15/0922 | 310/331 |
| 7,235,914 B2 * | 6/2007 | Richards | F02B 75/34 | 310/324 |
| 7,398,684 B2 * | 7/2008 | Kimino | G01P 15/123 | 73/514.33 |
| 7,652,972 B2 * | 1/2010 | Nam | B82Y 10/00 | 29/611 |
| 8,011,237 B2 * | 9/2011 | Gao | B60C 23/0411 | 73/146.5 |
| 2008/0229824 A1 * | 9/2008 | Higuchi | G01C 19/5621 | 73/504.16 |
| 2009/0151453 A1 * | 6/2009 | Momose | G01P 15/0922 | 73/504.14 |
| 2009/0322183 A1 | 12/2009 | Kawakubo et al. | | |
| 2010/0270889 A1 * | 10/2010 | Xu | G01P 15/09 | 310/329 |
| 2011/0132098 A1 | 6/2011 | Ballandras et al. | | |
| 2011/0192228 A1 * | 8/2011 | Nagai | G01C 19/00 | 73/514.16 |
| 2011/0234206 A1 | 9/2011 | Kawakubo et al. | | |
| 2013/0104677 A1 | 5/2013 | Watanabe et al. | | |
| 2013/0167669 A1 | 7/2013 | Watanabe et al. | | |
| 2014/0062258 A1 | 3/2014 | Koyama et al. | | |
| 2015/0063062 A1 * | 3/2015 | Fernihough | G01H 11/08 | 367/15 |

* cited by examiner

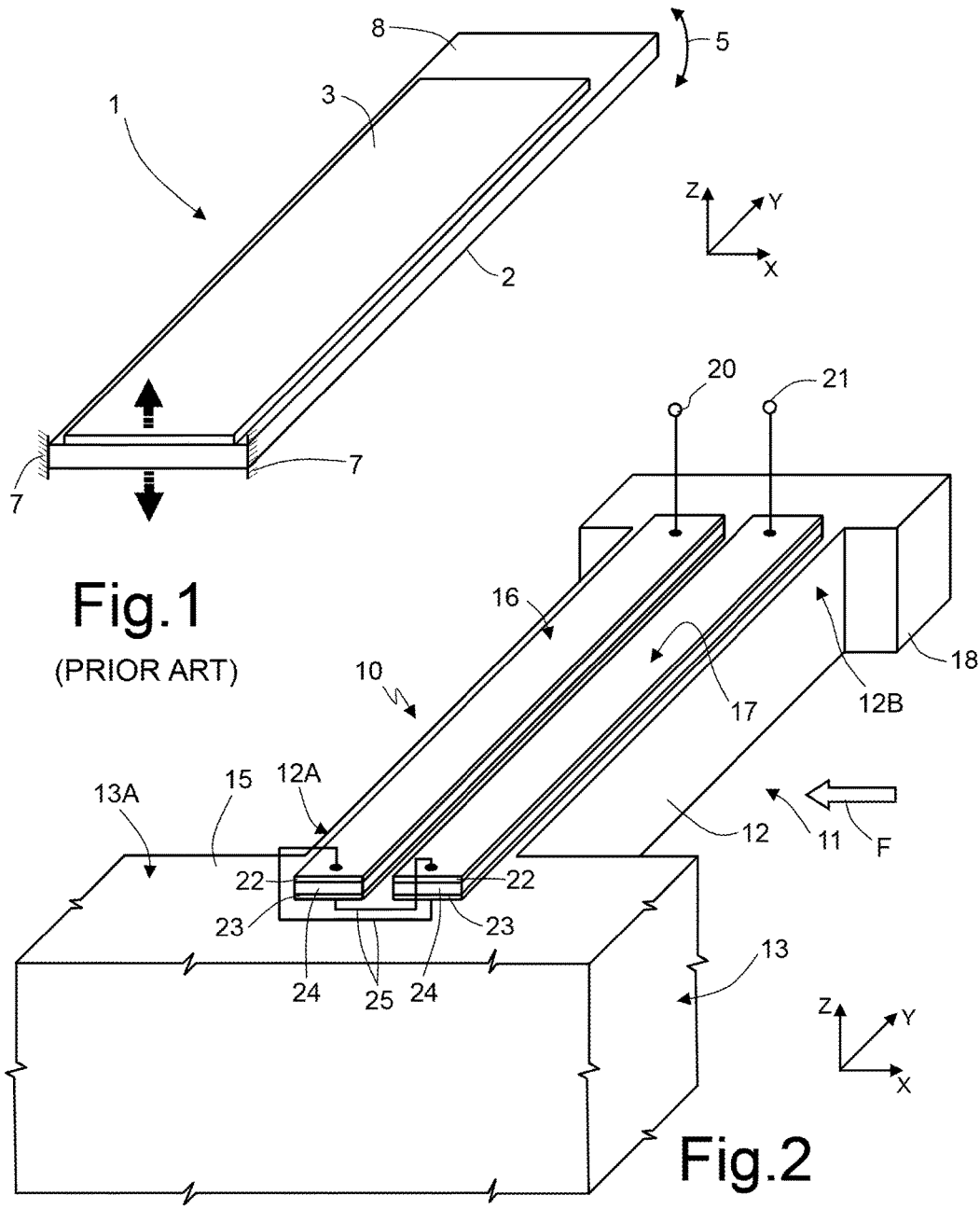
Fig.1
(PRIOR ART)
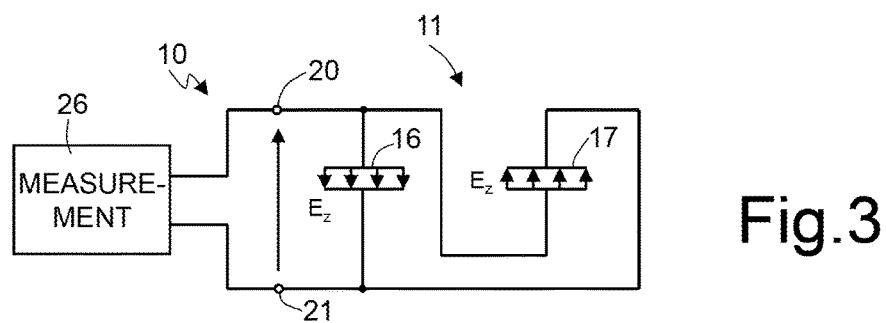
Fig.2
Fig.3

INTEGRATED PIEZOELECTRIC SENSOR FOR DETECTING IN-PLANE FORCES, SUCH AS SHOCKS, ACCELERATIONS, ROTATIONAL FORCES

BACKGROUND

Technical Field

The present disclosure relates to an integrated piezoelectric sensor for detecting in-plane forces, such as shocks, accelerations, uniaxial forces and accelerations, and rotational forces. In particular, the disclosure regards a sensor obtained using semiconductor technology, typically with the technology for the manufacture of MEMS devices, for detecting forces acting in the plane of the sensor.

Description of the Related Art

As is known, when piezoelectric materials are subjected to physical stresses and undergo deformation, they are biased, thus generating a potential difference across them and generating electrical charges. By connecting these materials to an external circuit, a piezoelectric current correlated to the forces applied is thus obtained.

The above phenomenon has been studied for years and is exploited in order to provide sensors where a sensing structure, typically a cantilever beam or cantilever having at least one piezoelectric region, undergoes deformation following upon mechanical stresses and generates an electric current. By connecting the sensing structure to a measurement circuit, such as an amperometer and a processing stage, the latter may detect the charge or potential difference and determine the force acting on the cantilever.

In this way, a piezoelectric sensor is able to measure forces such as linear and rotational forces, for example accelerations, shocks, etc.

The geometrical dimensions, the properties of the materials, and in general the entire design of the sensing structure of the sensor are generally optimized according to the physical quantity to be detected.

For instance, for a shock sensor, it is possible to use a sensing structure 1 as shown in FIG. 1. Here, a piezoelectric sensor 1 comprises a cantilever 2 carrying a piezoelectric layer 3, for example a PZT (lead zirconate titanate) crystal. The cantilever 2 is constrained in 7 and has one free end 8. In case of external forces 4 acting on the cantilever 2, these cause curving and upward or downward bending of the cantilever 2, as indicated by the arrow 5. This bending causes a deformation of the free end 8 of the cantilever 2 and generation of a stress that may be detected via a suitable measurement circuit.

The piezoelectric sensor 1 of FIG. 1 is suitable for detecting deformations due to forces or stresses acting in a perpendicular direction to the lying plane of the cantilever 2, so-called "out-of-plane direction". Thus, in the example shown, wherein the cantilever 2 extends to a first approximation in the plane XY, the piezoelectric sensor 1 is able to detect forces and stresses causing movement of the free end of the cantilever 2 in direction Z.

The piezoelectric sensor 1 is not, however, able to detect the action of forces and stresses acting in the plane XY. In order to detect these forces, the piezoelectric sensor 1 is rotated through 90° in such a way that the cantilever 2 extends parallel to a plane passing through the axis Z.

This, however, causes production of the sensing structure to be decidedly complex, since manufacturing and assembly are complex and entail higher costs, the overall dimensions of the sensing structure are greater, and the sensing structure has a lower precision than the in-plane sensing structure.

Other known solutions envisage embedding, in the structure of the cantilever, layers of piezoelectric material that extend according to a lying plane transverse to the plane XY, for example at 45° with respect to the sensor plane. These solutions are, however, particularly complex from the manufacturing standpoint, and thus costly. They may not thus be used in all low-cost applications.

BRIEF SUMMARY

In one embodiment, the present disclosure provides a piezoelectric sensor comprising a semiconductor material chip having a surface defining a plane and integrating a sensing structure for sensing forces acting in the plane, the chip including a substrate forming a first cantilever having an elongated shape defining a longitudinal direction with a first and a second end, the first end being constrained to an anchorage portion, the first cantilever defining a first and a second longitudinal halves and bearing a first strip element of piezoelectric material extending parallel to the chip plane on the first longitudinal half of the first cantilever.

In another embodiment, the present disclosure provides a method of manufacturing a piezoelectric sensor, comprising: forming first and second strips along a longitudinal direction of a substrate, each of said strips having a piezoelectric layer positioned between respective first and second electrode layers, the substrate forming a cantilever extending in the longitudinal direction; electrically coupling the first electrode layer of the first strip to the second electrode layer of the second strip; electrically coupling the second electrode layer of the first strip to the first electrode layer of the second strip; etching the substrate to form a cantilever extending in the longitudinal direction, said cantilever including the first and second strips.

In another embodiment, the present disclosure provides a system, comprising: a piezoelectric sensor, the piezoelectric sensor including a semiconductor material chip having a surface defining a plane and integrating a sensing structure for sensing forces acting in the plane, the chip including a substrate forming a first cantilever having an elongated shape defining a longitudinal direction with a first and a second end, the first end being constrained to an anchorage portion, the first cantilever defining a first and a second longitudinal halves and bearing a first strip element of piezoelectric material extending parallel to the chip plane on the first longitudinal half of the first cantilever; and a measurement circuit electrically coupled to the piezoelectric sensor and configured to determine a value of an external force acting on the first cantilever.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein:

FIG. 1 is a perspective view of a piezoelectric force-sensing structure of a known type;

FIG. 2 is a perspective view of an embodiment of a force-sensing structure used in an in-plane force sensor;

FIG. 3 shows an equivalent electrical diagram of the force sensor comprising the sensing structure of FIG. 2;

DETAILED DESCRIPTION

Figure 4:
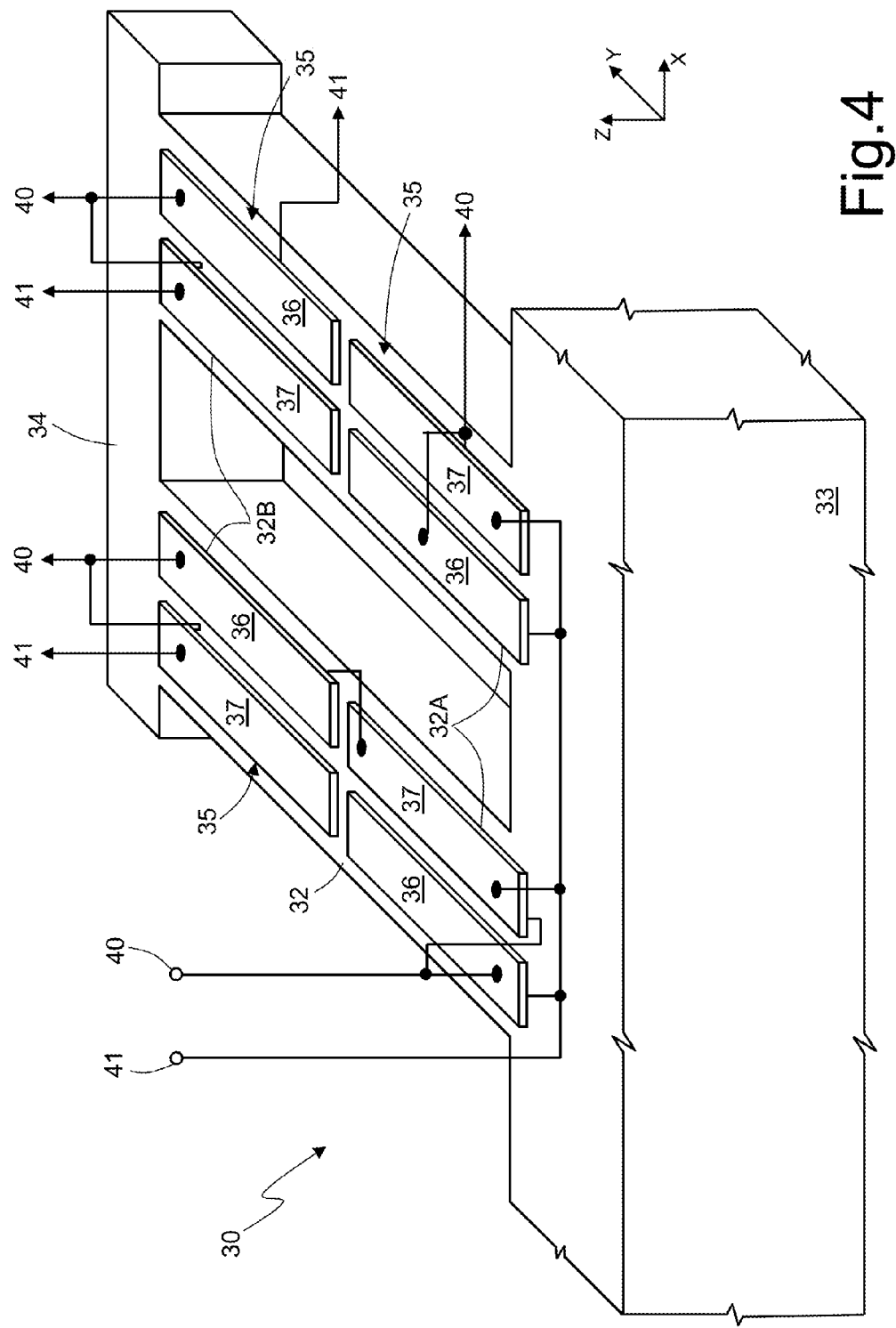
FIG. 4 is a perspective view of an embodiment of a sensing structure a force sensor.

FIGS. 2 and 3 show an embodiment of a sensing structure 11 of a force sensor 10 for detecting forces or stresses directed in the plane of the structure.

The sensing structure 11 is formed in a substrate 13 forming a chip, as represented more clearly in FIGS. 8A-8E. The substrate 13 is of a material commonly used in the semiconductor industry; for example, it may be silicon or an SOI substrate. The substrate 13 has a main surface 13A defining a plane XY, forming the sensitivity plane of the force sensor 10.

The substrate 13 monolithically forms a beam 12 of a cantilever type having a main extension direction (longitudinal direction) parallel to axis Y, a first end (constrained end) 12A fixed to an anchorage area 15 of the substrate 13, and a second end (free end) 12B. The cantilever 12 may have a thickness in direction Z smaller than the substrate 13, for example negligible with respect to the other two dimensions, even though this is not mandatory, as discussed below.

A longitudinal plane parallel to axes YZ and passing through the midline of the cantilever 12 delimits two longitudinal halves of the cantilever 12.

The substrate 13 may integrate other structures and electronic components (not shown).

Two strips 16, 17 extend over the cantilever 12, longitudinally with respect to the cantilever 12, substantially throughout the length of the cantilever 12, adjacent to each other, parallel and preferably equal, to have the same piezoelectric characteristics. Each strip 16, 17 has a smaller width than half width of the cantilever 12 and extends along a respective longitudinal half of the cantilever 12. Each strip 16, 17 comprises a piezoelectric region 24, of piezoelectric material, such as PZT (lead zirconate titanate), a top and a bottom electrodes 22, 23, both of metal.

The two strips 16 and 17 are connected in an opposite way, as shown schematically in FIG. 2 by electrical connections 25, generally formed by metal connections on the surface of the substrate 13 (see also FIGS. 8A-8E).

In detail, as shown in FIG. 3, where each strip 16, 17 is represented by a capacitor designated by the same reference number, the top electrode 22 of the first strip 16 is connected to a first reading node 20, and the bottom electrode 23 of the first strip is connected to a second reading node 21. Furthermore, the top electrode 22 of the second strip 17 is connected to the second reading node 21, and the bottom electrode 23 of the second strip 17 is directly connected to the first reading node 20.

The reading nodes 20, 21 are further connected to a measurement circuit 26, which may be integrated in the same substrate 13 or in a suitably provided ASIC (not shown).

In the embodiment shown, the free end 12b of the cantilever 12 has an enlarged portion 18, which, by increasing the weight of the cantilever 12, enables reduction of the resonance frequency of the detection system.

In use, in presence of an external force acting in the plane on the cantilever 12, the latter bends in the same plane XY. In the drawing plane of FIG. 2, in practice, the free end 12b of the cantilever 12 moves to the left or to the right, according to the direction of the external acting force, causing compression of one side of the cantilever 12 and stretching of the other side. For instance, a force F directed to the left in FIG. 2 causes compression of the left side of the cantilever 12 and of the first strip 16, and stretching of the right side of the cantilever 12 and of the second strip 17. Instead, a force in the opposite direction would cause compression of the right side of the cantilever 12 and of the second strip 17, and stretching of the left side of the cantilever 12 and of the first strip 16.

The two strips 16 and 17 thus undergo separate and different (opposite) deformations. They thus give rise to equal and opposite electrical fields $E_Z$ (see FIG. 3) that may be detected separately or in combination to add up the effects thereof.

In particular, by connecting the two strips 16 and 17 as described, the voltage variations between the electrodes 22, 23 of the individual strips 16, 17, of an opposite value, add up, and an electrical charge Q arises between the bias and reading nodes 20, 21 as given by the following equations (the first two are specific for the piezoelectric materials, and the third is Gauss's law):

$$\begin{cases} \sigma_{PZT} = E_{PZT} \cdot \varepsilon_{PZT} - e \cdot E_Z \\ D_{ind} = e \cdot \varepsilon_{PZT} + \varepsilon_{e1} \cdot E_z \\ \int_A D_{ind} \cdot dA = Q \end{cases} \quad (1)$$

where $\sigma_{PZT}$ is the stress on the strips 16, 17, correlated to the force F and the value whereof may be obtained analytically for simple geometries or may be easily obtained with a FEM software, $E_{PZT}$ is Young's modulus of the piezoelectric material, $\varepsilon_{PZT}$ is the deformation, e is the piezoelectric constant (C/m$^2$), $E_Z$ is the generated electric field, $D_{ind}$ is the electric displacement field, $\varepsilon_{e1}$ is the piezo electric permittivity ($\varepsilon_{e1} = \varepsilon_0 \varepsilon_r$), A is the area thereof, and Q is the charge generated thereon. Using Eqs. (1) it is thus possible, in a known way, to determine the value of the external force acting on the cantilever 12.

It should be noted that the sensing structure 30 is able to detect the forces acting in a planar direction, perpendicular to the direction of the cantilever 12, here the direction X, and is insensitive to forces oriented in the perpendicular directions Y and Z. In order to detect forces oriented in the plane in both directions X and Y, it is thus sufficient to use two sensors having respective cantilevers oriented perpendicular to each other.

FIG. 4 shows an embodiment of a sensing structure 30 characterized by high sensitivity.

The force sensor of FIG. 4 comprises a plurality of cantilevers 32 parallel to each other, whereof FIG. 4 shows two cantilevers 32, equal to each other. Analogously to FIG. 2, each cantilever 32 has a first end 32A anchored to a fixed anchorage area of the substrate 33 and a second end 32B. The second ends 32B of the cantilevers 32 are connected together through a transverse portion 34, which extends in a direction that is transverse (perpendicular) to the cantilevers 32 and fixedly thereto, so that all the second ends 32B deflect exactly in the same way.

Each cantilever 32 carries two pairs of strips 35, each pair of strips 35 comprising a first strip 36 and a second strip 37.

Each strip 36, 37 is in turn formed as described with reference to FIG. 2 and thus comprises a piezoelectric region 24, a top electrode 22, and a bottom electrode 23, in a way not represented in FIG. 4.

In detail, in each cantilever 32, each pair of strips 35 extends for approximately half the length of the respective cantilever 32 so that each first strip 36 extends laterally (in a direction perpendicular to the cantilevers 32) side-by-side to a respective second strip 37 of the same pair of strips 35 and longitudinally has a respective second strip 37 of a different pair of strips 35. The strips 36 and 37 of each pair of strips 35 are further connected together and to a pair of reading nodes 40, 41 similarly to what described with reference to FIGS. 2 and 3. Furthermore, the pairs of strips 35 on a same cantilever 32 are connected together and to the reading nodes 40, 41 in a specular way. Thus, in the longitudinal direction, each cantilever 32 carries two strip elements, which are in turn formed by a first strip 36 and by a second strip 37.

In particular, the first strips 36 (in the example shown, the strips 36 arranged closer to the first ends 32A of the respective cantilevers 32, on a first side of the respective cantilever 32—for example, to the left in FIG. 4—and the first strips 36 arranged closer to the second end 32B of the respective cantilever 32 on a second side of the cantilever—for example, to the right in FIG. 4) have top electrodes (not shown) connected to the first reading node 40 and bottom electrodes (not shown) connected to the second reading node 41. Instead, the second strips 37 have top electrodes (not shown) connected to the second reading node 41 and bottom electrodes (not shown) connected to the first reading node 40.

Thereby, the arrangement of FIG. 4 is equivalent to an electrical circuit similar to that of FIG. 3, with eight capacitors connected in an alternating way.

Figure 5:
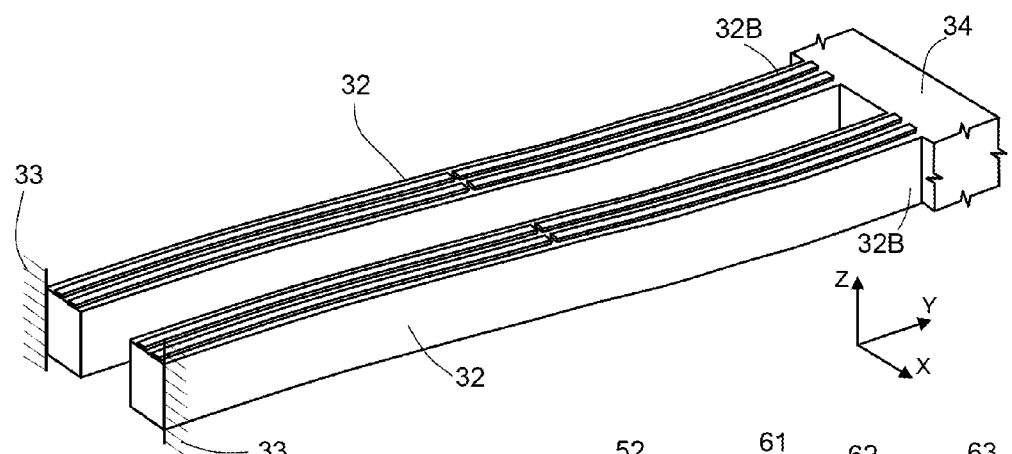
FIG. 5 is a perspective view of the deformation of the structure of FIG. 4 in presence of external forces.

With the arrangement of FIG. 4, as shown in FIG. 5, the cantilevers 32 undergo an S-like deformation, since their second ends 32B are no longer free, but constrained by the transverse portion 34 to move in the same way, perpendicular to the longitudinal direction of the cantilevers 32 (parallel to the direction X).

With the structure of FIG. 4 it is possible to obtain a higher sensitivity, by virtue of the larger number of cantilevers 32. The presence of the transverse portion 34 ensures the coordinated movement of the cantilevers, as well as enabling elimination of the effects of any possible asymmetry and unhomogeneity between the cantilevers 32, which could cause resonance frequencies that are different from each other and would thus require a more complex processing of the signals generated by the sensing structure. The presence of at least two pairs of strips 35 on each cantilever 32, i.e., the presence of first and second strips 36, 37 of an opposite type aligned in the longitudinal direction of each cantilever 32, enables detection of the existing deformation even if the mean value of deformation along the cantilevers 32 is zero.

Figure 6:
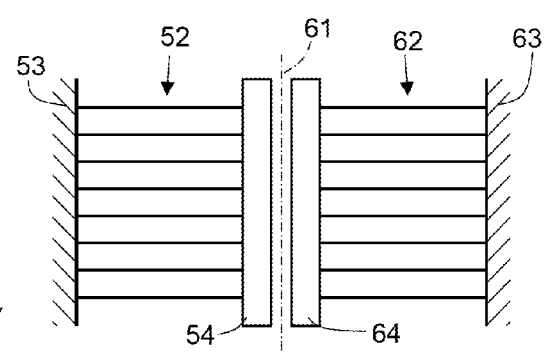
FIG. 6 is a schematic illustration of an embodiment of a force sensor for detecting both linear and rotational forces.

FIG. 6 shows an embodiment enabling detection of forces both of a linear type and of a rotational type.

In the sensing structure 60 of FIG. 6, two pluralities of cantilevers 52, 62 (referred to hereinafter also as "first cantilevers" 52 and "second cantilevers" 62) are arranged symmetrically with respect to each other in a plane of symmetry 61 perpendicular to the drawing plane (and thus to the longitudinal direction Y of the cantilevers 52, 62). Each plurality of cantilevers 52, 62 may be formed as shown in FIG. 4 and thus has pairs 35 of piezoelectric strips 36, 37. The first cantilevers 52 are fixed at a same first anchorage area 53 on their first ends and have second ends constrained to a first transverse portion 54. The second cantilevers 62 are fixed at a same second anchorage area 63 on their first ends and have second ends constrained to a second transverse portion 64. The transverse portions 54, 64 are arranged side-by-side and parallel. The plurality of cantilevers 52, 62 and the transverse portions 54, 64 preferably have the same structure, in particular, the same thickness, length, and width, so that the sensing structure is completely symmetrical with respect to the plane 61.

Figure 7A:
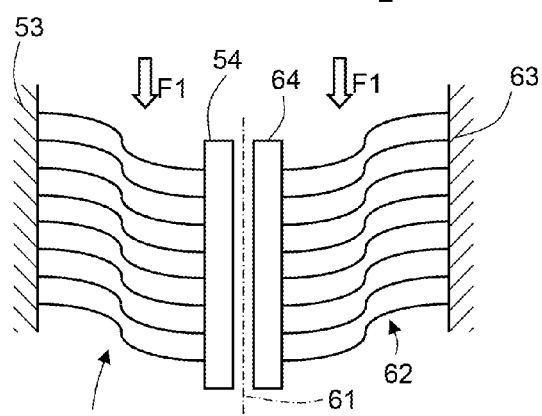
FIGS. 7A and 7B are schematic illustrations of the behavior of the force sensor of FIG. 6 in presence of an external linear force and of an external rotational force, respectively.

In use, in presence of a linear force F1 lying in the sensor plane (plane XY), the force acts on both pluralities of cantilevers 52, 62 in the same way, as exemplified in FIG. 7A. Consequently, the first and second cantilevers 52, 62 undergo deformation in the same direction, and the electrical signals generated by each plurality of cantilevers 52, 62 are the same.

Figure 7B:
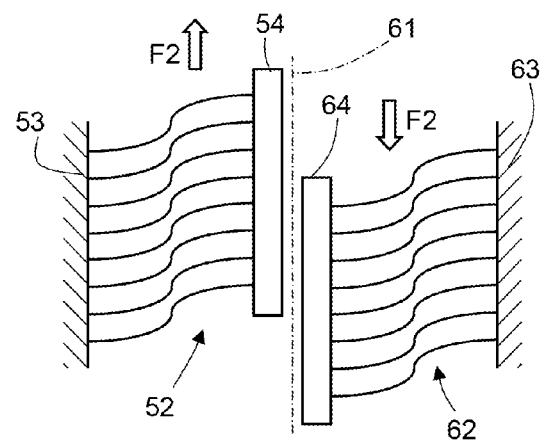
Figure 8A:
FIGS. 8A-8E are cross views illustrating a sensing structure in successive manufacturing steps, in accordance with one or more embodiments.
Figure 8B:
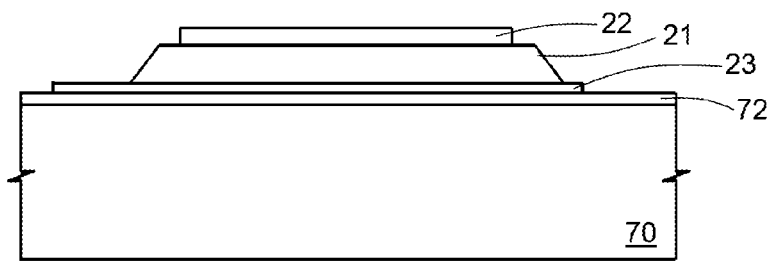
Figure 8C:
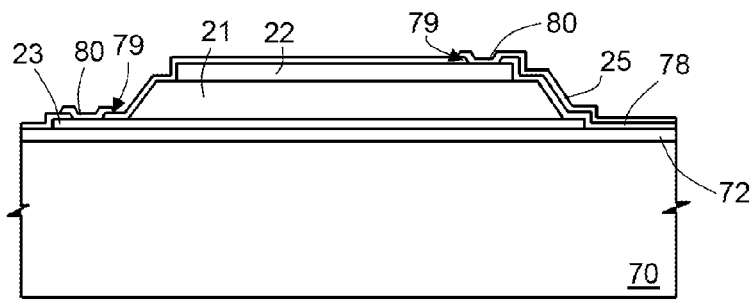
Figure 8D:
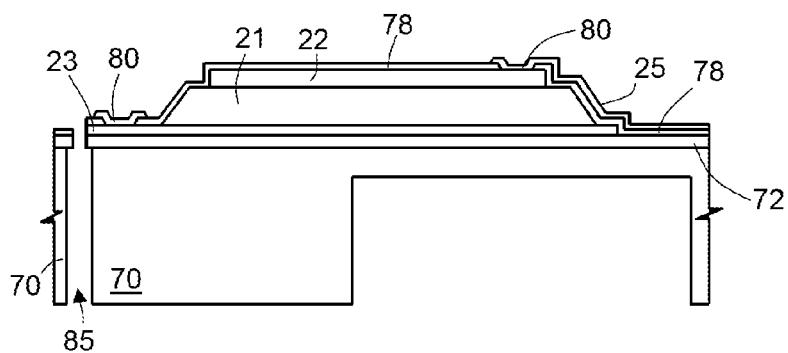
Figure 8E:
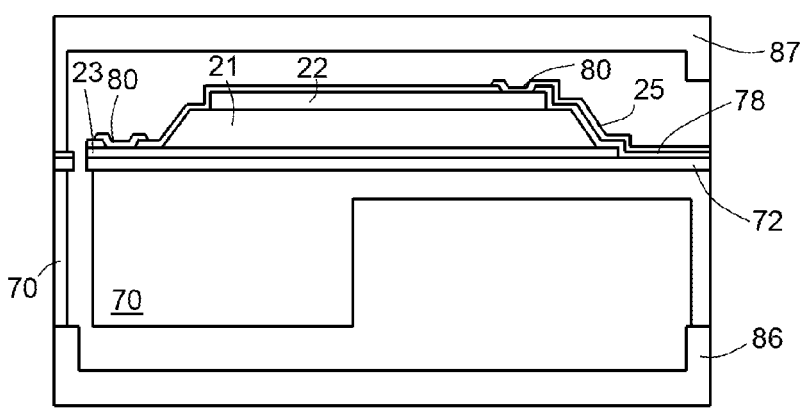

Instead, in presence of a rotational force F2, this force acts in the opposite direction on each plurality of cantilevers 52, 62, as exemplified in FIG. 7B. Consequently, the first cantilevers 52 and the second cantilevers 62 undergo deformation in opposite directions and generate electrical signals of opposite signs.

A measurement circuit downstream of the sensing structure of FIG. 7 is thus able to detect the type of force acting on the sensor.

The sensing structures shown in FIGS. 2-7 may be manufactured as described hereinafter with reference to FIGS. 8A-8E, showing cross-sections of a chip of semiconductor material taken in the longitudinal direction of a cantilever 12, 32, 52, or 62.

Initially (FIG. 8A), a bottom electrode layer 73, for example of titanium and platinum oxide, a piezoelectric layer 74, and a top electrode layer 75, for example a ruthenium layer, are deposed on a substrate 70 of a standard type, for example a silicon substrate or a SOI (Silicon-On-Insulator) substrate, covered by an insulating layer 72, typically thermal silicon oxide.

Next (FIG. 8B), the top electrode layer 75, the piezoelectric layer 74, and the bottom electrode layer 73 are defined in sequence, using photolithographic techniques, for forming the strips 16, 17, 36, and 37 including the respective piezoelectric regions 24 and the respective top electrodes 22 and bottom electrodes 23.

Then (FIG. 8C), a passivation layer 78, for example a silicon-oxide layer, is deposited, the passivation layer 78 is selectively removed so as to locally expose the bottom and top electrodes 23, 22 and open vias 79, a metallization layer, for example of platinum, is deposited, and the metallization layer is defined to form contact structures 80 and electrical-connection lines 25.

Next (FIG. 8D), the substrate 70 is etched both from the front and from the back, in order laterally free the cantilevers 12, 32, 52, 62 to form trenches 85 and (if envisaged) remove part of the substrate 70 at the bottom for thinning out the cantilevers 12, 32, 52, 62. Thinning of the cantilevers 12, 32, 52, 62 is not, however, necessary, since the characteristics of the sensor (sensitivity and resonance frequency) do not depend upon the thickness of the sensing structure. Furthermore, the possibility of movement of the cantilevers 12, 32, 52, 62 may be guaranteed by the shape of the bottom cap.

Finally (FIG. 8E), a bottom cap 86 and a top cap 87 are fixed to the substrate 70, in a known manner.

The force sensor described has many advantages.

Reading based upon the phenomenon of piezoelectricity involves low noise, and thus the sensor has a high sensitivity.

The sensor is configured according to a vertical layer structure of a standard type, and thus assembly is of a standard type and does not entail additional costs as in the case of sensors arranged rotated through 90°.

Few manufacturing steps are required after the typical steps for manufacturing piezoelectric structures.

The sensor has an extremely compact structure, and thus the overall dimensions are reduced.

The sensitivity of the sensor is independent of the cantilever thickness, and thus the sensor is not subject to imprecision and process spread for thickness variations in the lots.

The sensor may detect forces of a different type, such as shocks, accelerations, linear and rotational forces, as described above.

Finally, it is clear that modifications and variations may be made to the sensor described and illustrated herein, without thereby departing from the scope of the present disclosure, as defined in the attached claims. For instance, the described different embodiments may be combined for providing further solutions.

In addition, even though the shown structures always have at least one pair of piezoelectric strips, whereof each extend on a respective longitudinal half of each cantilever, it is possible to form a single strip on one longitudinal half of the respective cantilever, which undergoes compression or tensioning according to the deformation of the cantilever and the output signal whereof is thus uniquely correlated to the direction and value of the force acting on the sensing structure.

For instance, also the single-cantilever solution of FIG. 3 may have pairs of strips 35, analogously to FIG. 4. Furthermore, if desired, each cantilever may have more than two pairs of strips 35 following each other in the length direction of the cantilever. Furthermore, each cantilever may have more than two strips arranged alongside each other, preferably in even numbers.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A piezoelectric sensor, comprising:
   a semiconductor material chip having a surface defining a plane, the chip including a substrate;
   a sensing structure configured to sense forces acting in the plane;
   a cap;
   an anchorage portion of the substrate, the substrate fixed to the cap at the anchorage portion; and
   a first cantilever in the substrate, the first cantilever having a first end and a second end, the first cantilever having an elongated shape defining a longitudinal direction between the first and the second end, the first end extending from and constrained by the anchorage portion, the first cantilever defining a first longitudinal half and a second longitudinal half and bearing a first strip element of piezoelectric material on the first longitudinal half of the first cantilever, the first strip element extending parallel to the plane.

2. The sensor according to claim 1 wherein the first strip element extends over the first cantilever, and the first cantilever is monolithic with the substrate.

3. The sensor according to claim 1, comprising a second strip element of piezoelectric material on the first cantilever and extending parallel to the plane on the second longitudinal half of the first cantilever, laterally with respect to the first strip element.

4. The sensor according to claim 3 wherein the first cantilever has a width in a first direction perpendicular to the longitudinal direction, and the first and second strip elements have a width in the first direction less than half the width of the first cantilever, the first and second strip elements having the same length and width.

5. The sensor according to claim 3, comprising a second cantilever extending parallel to the first cantilever and having a first end constrained to the anchorage portion of the substrate and a second end fixed to the second end of the first cantilever through a first transverse cantilever portion, the second cantilever defining a first and a second longitudinal halves and bearing a third strip element of piezoelectric material extending parallel to the plane on the first longitudinal half of the second cantilever, the first and second cantilevers forming a first plurality of cantilevers.

6. The sensor according to claim 5 wherein the third strip element extends over the second cantilever, and the second cantilever is monolithic with the substrate.

7. The sensor according to claim 5 wherein each strip element comprises a first and a second strip portion of piezoelectric material, the first and second strip portions extending aligned to each other between the first and the second end of a respective cantilever, and each strip portion includes a piezoelectric region, a first electrode, and a second electrode, wherein the second electrode of the first strip portion is coupled to the first electrode of the second strip portion and the second electrode of the second strip portion is coupled to the first electrode of the first strip portion.

8. The sensor according to claim 7 wherein the first electrodes of the first strip portions of the first and second strip elements are coupled to each other and form a first reading node, the second electrodes of the first strip portions of the first and second strip elements are coupled to each other and form a second reading node, the first and second reading nodes being coupled to a read circuit.

9. The sensor according to claim 8, comprising a fourth strip element on the second cantilever and extending parallel to the plane on the second longitudinal half of the second cantilever, alongside the third strip element, the first, second, third, and fourth strip elements each having a first and a second strip portion of piezoelectric material which extend aligned to each other between the first end and the second end of a respective cantilever, wherein the first strip portion of each strip element is arranged alongside a second strip portion of a laterally adjacent strip element, and wherein the second electrodes of the first strip portions are coupled to the first electrodes of the second strip portions and to the second reading node, and the second electrodes of the second strip portions are coupled to the first electrodes of the first strip portions and to the first reading node.

10. The sensor according to claim 5, comprising a second plurality of cantilevers, the second plurality of cantilevers including a second transverse cantilever portion adjacent and parallel to the first transverse cantilever portion, the first and second pluralities of cantilevers being arranged symmetrically with respect to each other and configured to detect rotational accelerations.

11. The sensor according to claim 1 wherein the substrate is packaged through a pair of caps fixed to the substrate.

12. The sensor according to claim 1 wherein the sensing structure is coupled to a reading module.

13. A piezoelectric sensor, comprising:
a semiconductor material chip having a surface defining a plane, the chip including a substrate;
a sensing structure configured to sense forces acting in the plane;
an anchorage portion;
a first cantilever in the substrate, the first cantilever having a first end and a second end, the first cantilever having an elongated shape defining a longitudinal direction between the first and the second end, the first end being constrained to the anchorage portion, the first cantilever defining a first longitudinal half and a second longitudinal half;
a first strip element of piezoelectric material on the first longitudinal half of the first cantilever, the first strip element extending parallel to the plane; and
a second strip element of piezoelectric material on the first cantilever and extending parallel to the plane on the second longitudinal half of the first cantilever, laterally with respect to the first strip element,
wherein the first and second strip elements each comprise a single strip of piezoelectric material extending longitudinally to the first cantilever between the first and second ends of the first cantilever, each single strip including a piezoelectric region, a first electrode, and a second electrode, wherein the second electrode of the first single strip is coupled to the first electrode of the second single strip, and the second electrode of the second single strip is coupled to the first electrode of the first single strip.

14. The sensor according to claim 13 wherein the first electrode and the second electrode of the first single strip form reading nodes coupled to a read circuit.

15. A method of manufacturing a piezoelectric sensor, comprising:
forming first and second strips along a longitudinal direction of a substrate, each of the strips having a piezoelectric layer positioned between respective first and second electrode layers;
electrically coupling the first electrode layer of the first strip to the second electrode layer of the second strip;
electrically coupling the second electrode layer of the first strip to the first electrode layer of the second strip; and
forming a cantilever extending in the longitudinal direction from the substrate by etching the substrate, the cantilever including the first and second strips.

16. The method according to claim 15, further comprising:
fixing a first cap to a first surface of the substrate; and
fixing a second cap to a second surface of the substrate.

17. The method according to claim 15, further comprising:
forming a passivation layer over the first and second strips and the substrate;
exposing at least a portion of the first and second electrode layers of the first and second strips by selectively removing portions of the passivation layer;
forming electrical contacts by depositing a metallization layer in the exposed portions of the first and second electrode layers of the first and second strips.

18. A system comprising,
a piezoelectric sensor, the piezoelectric sensor including:
a semiconductor substrate;
an anchorage portion;
a cantilever formed in the substrate, the cantilever having a first end and a second end, the first end being constrained to the anchorage portion; and
a first strip element of piezoelectric material on the cantilever, the first strip element having a first portion and a second portion that is aligned with and spaced apart from the first portion between the first end and the second end.

19. The system according to claim 18, further comprising:
a measurement circuit electrically coupled to the piezoelectric sensor and configured to determine a value of an external force acting on the cantilever.

20. The system according to claim 18, wherein the piezoelectric sensor includes a second strip element of piezoelectric material on the cantilever, the second strip element being positioned laterally with respect to the first strip element.

* * * * *